(12) United States Patent
Omura

(10) Patent No.: US 6,208,473 B1
(45) Date of Patent: Mar. 27, 2001

(54) CATADIOPTRIC PROJECTION LENS

(75) Inventor: Yasuhiro Omura, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/070,536

(22) Filed: Apr. 30, 1998

(30) Foreign Application Priority Data

Apr. 30, 1997 (JP) .................................................. 9-127926

(51) Int. Cl.[7] .................................................. G02B 17/00
(52) U.S. Cl. ......................... 359/727; 359/730; 359/732
(58) Field of Search ................................. 359/727, 726, 359/730, 732–736, 364, 362, 648–650, 728, 729, 731, 651; 355/43–45, 53

(56) References Cited

U.S. PATENT DOCUMENTS

| 3,917,399 | * | 11/1975 | Buzawa et al. ........................ 355/43 |
| 5,241,423 | | 8/1993 | Chiu et al. ........................... 359/727 |
| 5,591,958 | * | 1/1997 | Nishi et al. .......................... 250/205 |
| 5,691,802 | * | 11/1997 | Takahashi ............................ 359/727 |
| 5,742,436 | | 4/1998 | Furter .................................. 359/727 |
| 5,808,805 | * | 9/1998 | Takahashi ............................ 359/651 |
| 5,861,997 | * | 1/1999 | Takahashi ............................ 359/727 |
| 5,880,891 | * | 3/1999 | Furter .................................. 359/651 |
| 5,969,882 | * | 10/1999 | Takahashi ............................ 359/728 |

* cited by examiner

*Primary Examiner*—Georgia Epps
*Assistant Examiner*—Jordan M. Schwartz
(74) *Attorney, Agent, or Firm*—Oliff & Berridge PLC

(57) ABSTRACT

A catadioptric projection lens comprising a first lens group (G1) disposed along a first optical axis (16a), a mirror (18) which creates a second optical axis (16b), a beam splitter (20) which creates a third optical axis (16c), a second lens group (G2) including a concave mirror (L22) disposed along the third optical axis on one side of the beam splitter, and a third lens group (G3) disposed along the third optical axis on the side of the beam splitter. The first and third optical axes are parallel, a configuration which reduces aberrations arising from gravitational deformation of the lens elements, when the first and third axes are aligned with the direction of gravity.

30 Claims, 4 Drawing Sheets

CATADIOPTRIC PROJECTION LENS

FIELD OF THE INVENTION

The present invention relates to projection lenses, and more particularly to high-resolution, ultraviolet projection lenses for projection optical systems.

BACKGROUND OF THE INVENTION

The process of manufacturing certain electronic devices, such as semiconductor integrated circuits, liquid crystal displays and the like, requires the use of high-resolution projection optical systems. In such systems, a pattern on a photomask or "reticle" is illuminated with light from a source of illumination. The light passing therethrough is imaged onto a workpiece, such as a light-sensitive substrate (e.g., as a silicon wafer coated with photoresist) by a projection lens. Due to the increasing degree of integration of electronic devices, the resolution demanded by the projection optical system has steadily increased. To meet this demand, it is necessary for the projection lens of the projection optical system to operate at a shorter wavelength light and/or to have a larger numerical aperture (NA).

Shortening the operating wavelength of the projection optical system to the ultraviolet (UV) region of the electromagnetic spectrum has the consequence that a limited number of optical materials are available for use. For example, for wavelengths of light under 300 nanometers (nm), synthetic quartz and fluorite (calcium fluoride) are the only glass types that have suitable transmission properties. Unfortunately, the Abbe number of these glasses are close to one another, so it is difficult to compensate for the various aberrations in the projection lens, including chromatic aberration, for lens designs that employ only these glass types.

In contrast, reflective optical systems have no chromatic aberration. Thus, various projection lenses have been proposed which have both reflective and refractive lens elements (i.e., "catadioptric" lenses). Certain proposed high-resolution catadioptric projection lenses include a beam splitter for folding the optical path and have been disclosed in Japanese patent application Kokoku No. Hei 7-117648, Japanese patent application Kokai No. Hei 6-300973, Japanese patent application Kokai No. Hei 5-88089, Japanese patent application Kokai No. Hei 3-282527, PCT/EP95/01719, and U.S. Pat. No. 5,241,423.

The projection lenses disclosed in the above-identified patent applications have optical axes associated with the lens elements before to (i.e., upstream of) the beam splitter element and after (i.e., downstream of) the beam splitter element that are not parallel. However, the recent demands for higher NA, as well as larger field size, require that the size of the refractive elements and the reflective element be increased. Unfortunately, increasing the size of these lens elements is problematic because of the deformation effects of gravity when the projection lens is mounted in the projection optical system. When the optical axes of the refractive elements upstream and downstream of the beam splitter are not parallel, asymmetric deformations arise in the lens elements due to gravity. These deformations induce aberrations which unacceptably reduce the resolution of the projection lens. Unfortunately, these aberrations are such that they cannot be readily corrected during manufacturing.

SUMMARY OF THE INVENTION

The present invention relates to projection lenses, and more particularly to high-resolution, ultraviolet projection lenses for projection optical systems.

One aspect of the present invention is a catadioptric projection lens having an object plane and an image plane. The lens comprises, in order from the object plane to image plane, a first lens group having one or more refractive lens elements disposed along a first optical axis. Next is a first mirror, which creates a second optical axis that is not parallel to the first optical axis. Next to the first mirror, along the second optical axis, is a beam splitter, which creates a third optical axis that is parallel to the first optical axis. Next, disposed along the third axis, on the side of the beam splitter opposite the image plane, is a second lens group having one or more refractive lens elements, and which includes a concave mirror. Next, immediately adjacent the image plane and disposed along the third optical axis, is a third lens group having one or more refractive lens elements.

In another aspect of the invention, an aperture stop is included between the beam splitter and the third lens group.

One of the main benefits of this configuration is that when the first and third optical axes are made parallel to the direction of gravity, aberrations due to the deformation of the lens elements due to gravity are alleviated. This allows for a high NA (e.g., 0.6 and above) and short-wavelength (193 nm) design for achieving high resolution (e.g., 0.25 um or less).

DETAILED DESCRIPTION OF THE INVENTION

The present invention relates to projection lenses, and more particularly to high-resolution, ultraviolet projection lenses for projection optical systems. The projection lenses of the present invention are designed to alleviate the deformation effects of the lens elements due of gravity, which induce aberrations that are not readily correctable during manufacturing. To this end, the projection lens of the present invention includes a plurality of refractive lens elements arranged in three lens groups, one of which includes at least one concave mirror. In addition, the optical axes passing through the refractive lens elements are parallel. This configuration allows for the direction of the force of gravity to be in the same direction for each lens group. A preferred embodiment of the present invention is a narrow-band projection lens using quartz and/or calcium fluoride refractive lens elements and having high-resolution, such as sub-quarter micron, and a high NA, such as 0.6 or greater.

In a preferred embodiment, a reticle is disposed in a reticle holder capable of holding the reticle at or near the object plane of the projection lens of the present invention. In addition, a workpiece (e.g., a silicon wafer coated with photoresist) is disposed in a workpiece holder capable of holding the workpiece at or near the image plane of the projection lens. In the present invention, the object planes and image planes are substantially parallel to one another. The reticle and wafer are then scanned in parallel planes (typically, the object and image planes, respectively), which are at right angles to the optical axes of the lens groups upstream and downstream from the beam splitter.

Figure 1:
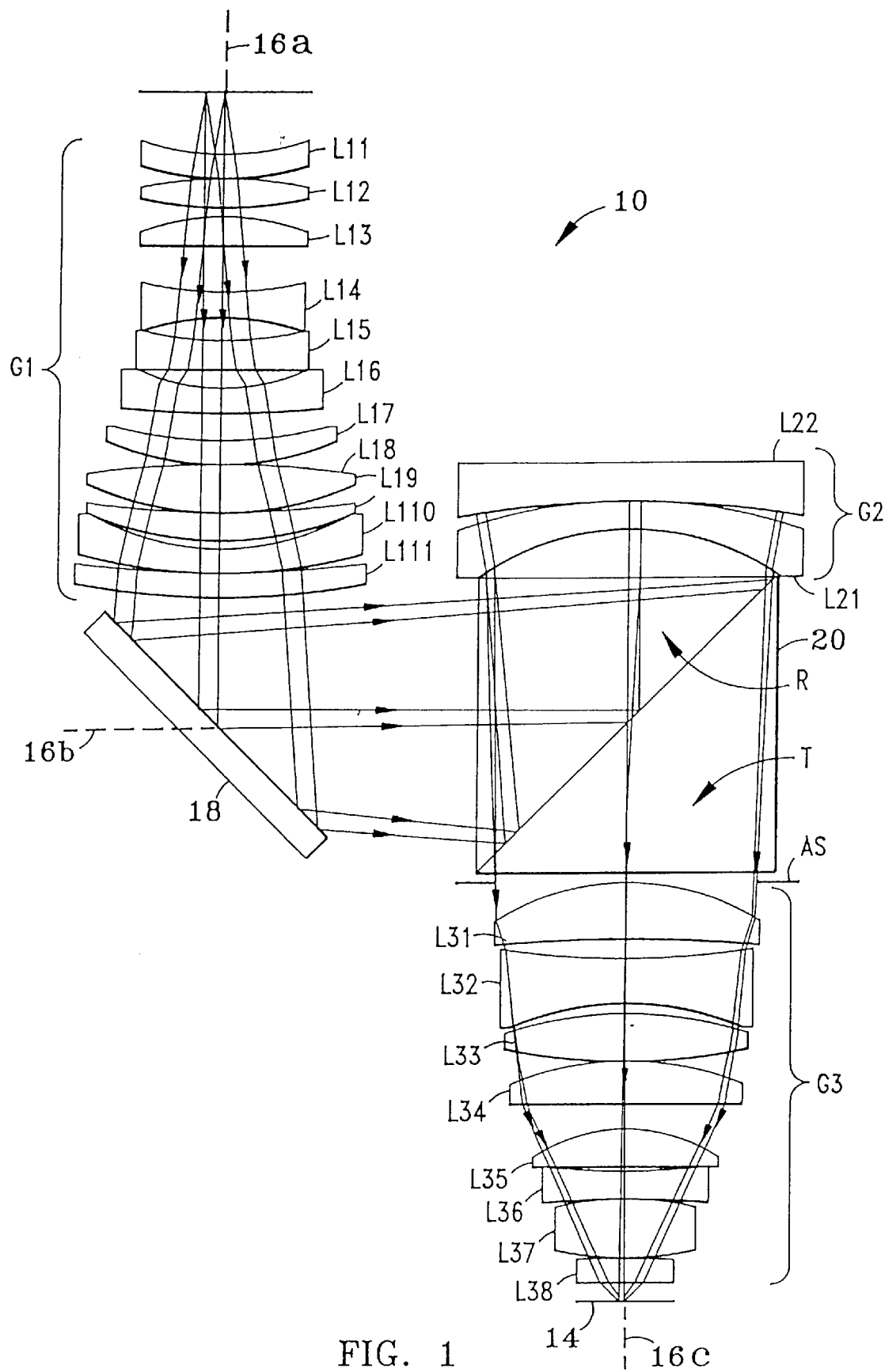
FIG. 1 is a schematic optical diagram of Working Example 1 of the present invention.
Figure 2A:
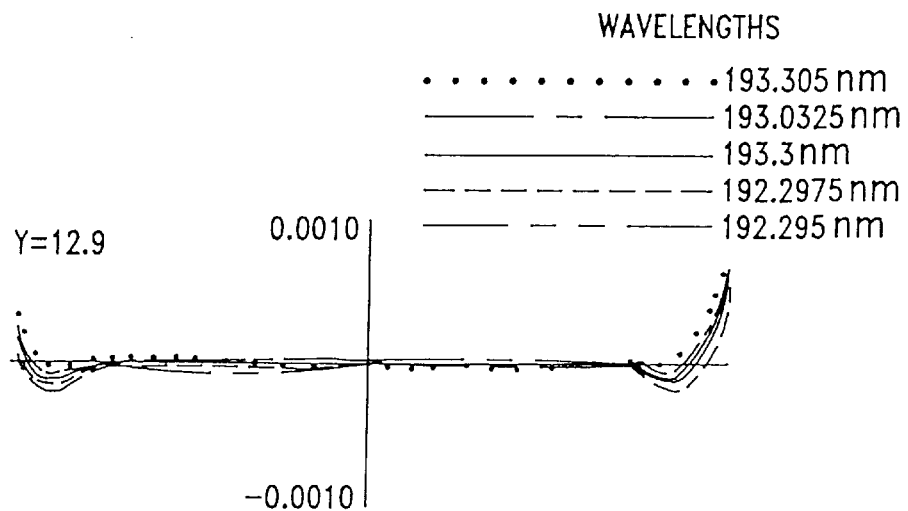
FIG. 2a–2c are plots of the transverse aberrations for five wavelengths and three image heights for Working Example 1.
Figure 2B:
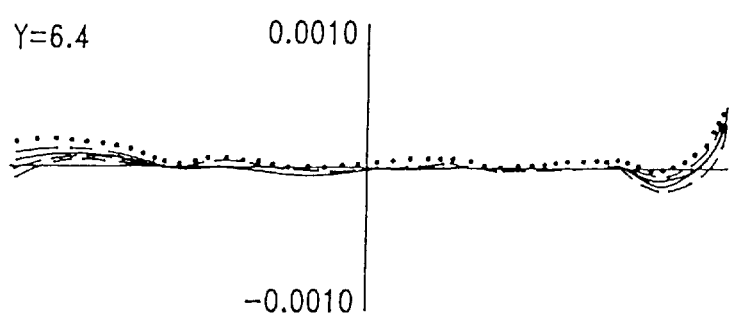
Figure 2C:
Figure 3:
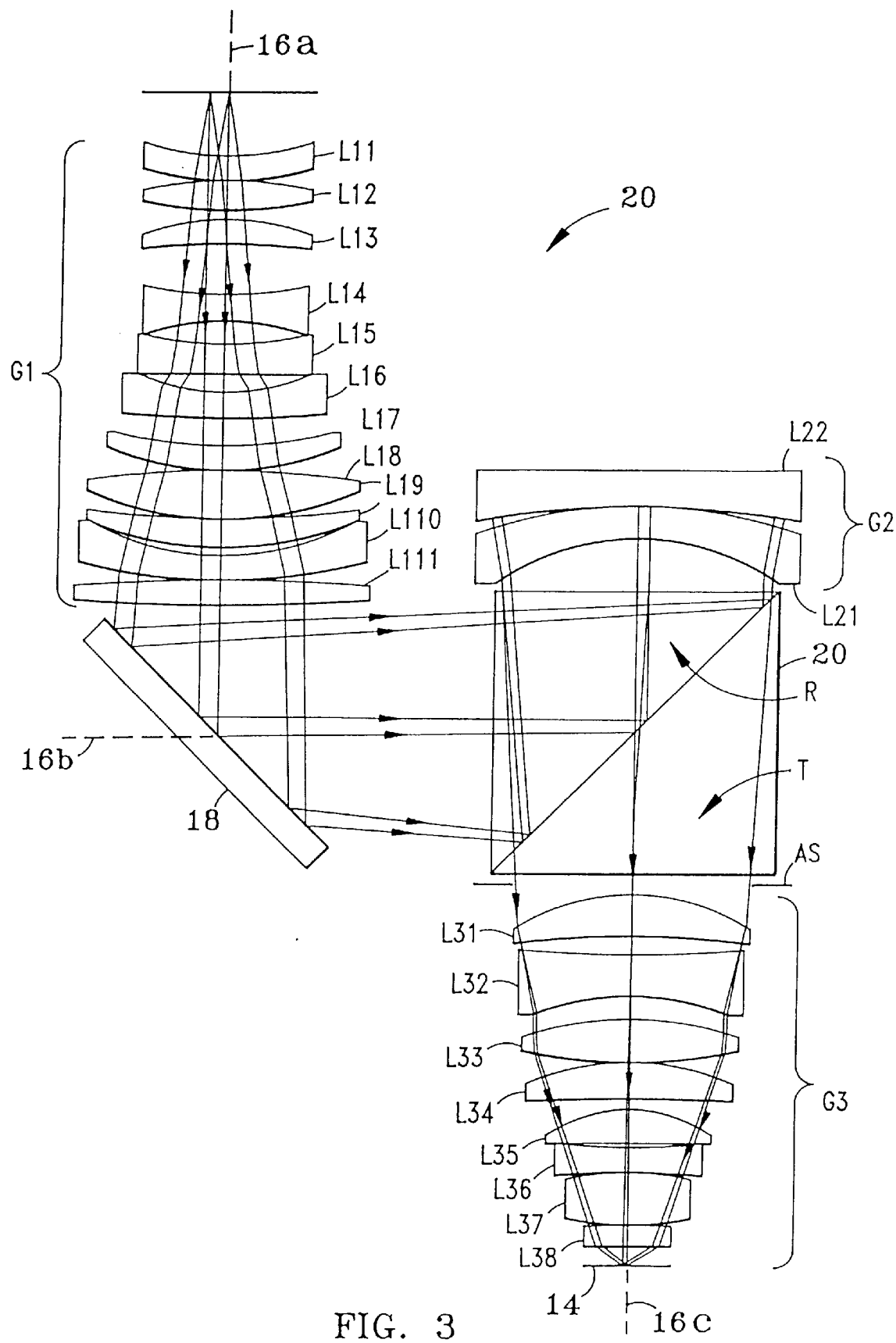
FIG. 3 is a schematic optical diagram of Working Example 2 of the present invention.
Figure 4A:
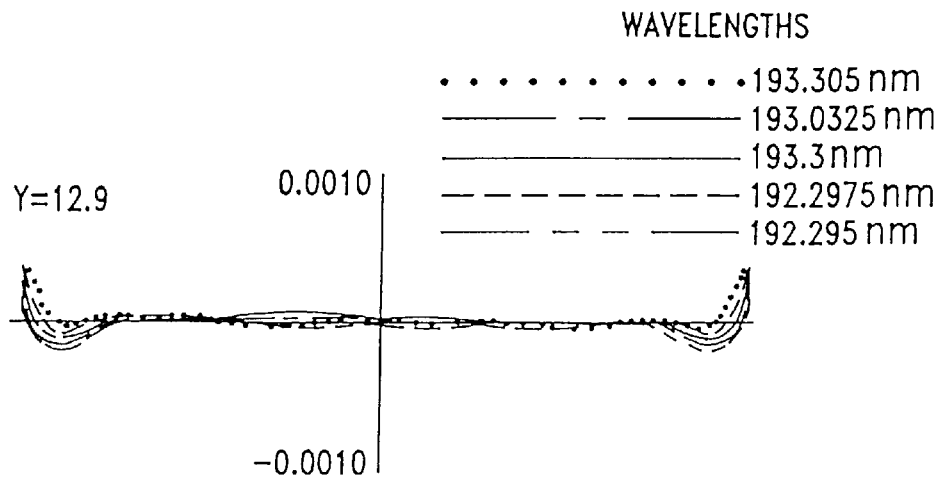
FIG. 4a–4c are plots of the transverse aberrations for five wavelengths and three image heights for Working Example 2.
Figure 4B:
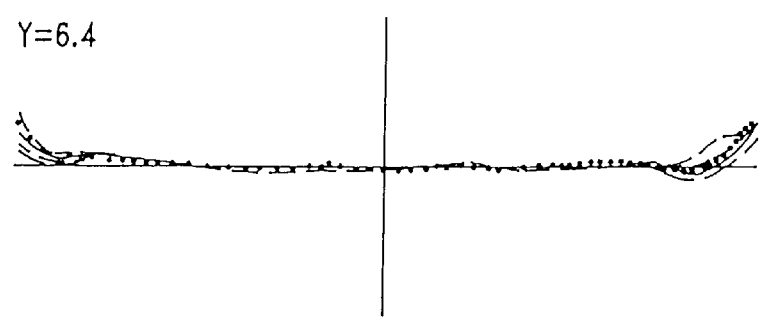
Figure 4C:
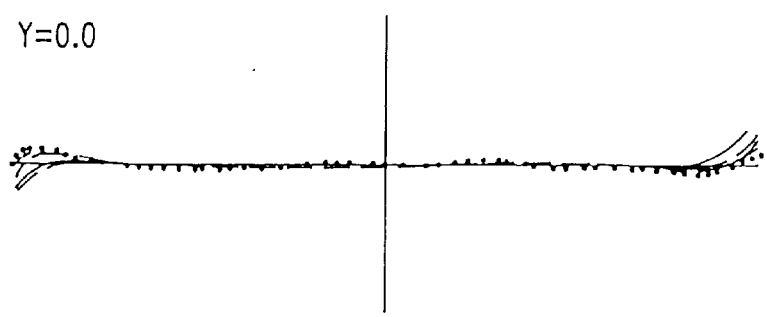

With reference to FIGS. 1 and 3, which show representative catadioptric projection lenses 10 and 20, the catadioptric projection lens of the present invention includes, in order from object plane 12 to image plane 14 along optical axes 16a–16c, a first lens group G1, a plane mirror 18, a beam splitter 20, a second lens group G2, which includes a concave mirror L22 disposed in the optical path R the reflection optical path of light ray bundles 24a and 24b reflected by beam splitter 20 in the direction opposite image plane 14, and a third lens group disposed in the optical path T the transmission optical path, immediately adjacent beam splitter 20 on the image-plane side.

Lens group G1, disposed along optical axis 16a, comprises a negative meniscus lens element L11 having an objectwise concave surface, a biconvex lens element L12, a biconvex lens element L13, a biconcave lens element L14, a biconvex lens element L15, a negative meniscus lens element l16 having an objectwise concave surface, a positive meniscus lens element L17 having an objectwise convex surface, a biconvex lens element L18, a positive meniscus lens element L19 having an objectwise convex surface, a negative meniscus lens element L110 having an objectwise convex surface, and a positive meniscus lens element L111 having an objectwise convex surface.

Lens group G2, disposed along optical axis 16c, comprises a negative meniscus lens element L21 having an objectwise concave surface, and a concave mirror L22.

Lens group G3, disposed along optical axis 16c, comprises a positive meniscus lens element L31 having an objectwise concave surface, a biconcave lens element L32, a biconvex lens element L33, a biconvex lens element L34, a positive meniscus lens element L35 having a objectwise convex surface, a biconcave lens element L36, a biconvex lens element L37, and a positive meniscus lens element L38 having an objectwise convex surface. An aperture stop AS is disposed between lens groups G2 and G3, or within lens group G3.

In a preferred embodiment of the present invention, beam splitter 20 is formed at the interface of a pair of right triangular prisms. This arrangement avoids the introduction of coma and astigmatism that accompanies the use of a plate-type beam splitter. Beam splitter 20 may be plate-type, prism-type, polarizing plate-type or polarizing prism-type.

Also, in preferred embodiment, lens group G1 satisfies the design condition $$-1 < 1/\beta_1 < 1 \tag{1}$$

wherein $\beta_1$ is the magnification of lens group G1. If the expression $1/\beta_1$ exceeds the upper limit of condition (1), it becomes difficult accommodate mirror 18 for folding the optical path, and beam splitter 20. If the expression $1/\beta_1$ falls below the lower limit of condition (1), the size of projection lens 10 increases, and the correction of off-axis aberrations becomes difficult. In a preferred embodiment, the lower limit of condition (1) is set at 0 or even 0.4, and the upper limit at 0.7.

In a preferred embodiment of the present invention, aperture stop AS is variable in size, thereby allowing for adjustment of resolution and depth of focus. Also, by making the projection lens image-side telecentric, distortion (i.e., image-placement error) as a function of defocus can be made negligible. Furthermore, to prevent undue light absorption and scattering, in a preferred embodiment, a polarizing beam splitter is used in combination with a ¼-wave plate disposed between beam splitter 20 (which, in the instant case would be a polarizing beam splitter) and concave mirror L22.

WORKING EXAMPLES

Working Examples 1 and 2, corresponding to projection lenses 10 and 20, respectively, are set forth in Tables 1 and 2, below, and in FIGS. 1 and 3, respectively, along with their corresponding aberration plots (FIGS. 2a–c and 4a–c, respectively). In the aberration plots, the various line types correspond to five different wavelengths ranging from 192.295 nm to 193.305 nm, as indicated. The Working Examples considered herein are reduction projection lenses used for printing by scanning a reticle (not shown) in object plane 12, while simultaneously scanning a wafer (not shown) in image plane 14, as discussed above (see FIG. 1 or FIG. 3). The scanning speed of the reticle and the wafer are synchronized based on the reduction magnification. In Tables 1 and 2, the "exposure region" is the field size at the reticle plane. The exposure region in Working Examples 1 and 2 is a rectangular slit having a long side of dimension "a" in the direction orthogonal to the scanning direction, and a short side "b" along the scanning direction. The exposure region is centered on optical axis 16a. Note that mirror 18 and beam splitter 20 bend the optical path by 90 degrees so that optical axis 16a and optical axis 16c are parallel. Also, aperture stop AS is disposed between beam splitter 20 and lens group G3.

In Tables 1 and 2, "S" is the surface number, "r"=is the radius of curvature, which is positive when the lens surface precedes the center of curvature in relation to the incident light (however, the sign of the curvature reverses at each reflection), "d" is the spacing between adjacent surfaces (which sign reverses at each reflection), "Glass Type" is the type of glass of the particular lens element, and "Lens Group" identifies the lens group to which the particular lens element belongs. Also, Working Examples 1 and 2 have a plurality of lenses configured as described above, and have a plate-type beam splitter. Note, however, that a prism-type beam splitter may also be used.

TABLE 1

Exposure wavelength = 193.3 nm ± 5 pm
Quartz (synthetic quartz): refractive index = 1.56033
$CaF_2$ (fluorite): refractive index = 1.50146
Image-side NA = 0.650
Exposure region: a = 25 mm b = 6 mm
$1/\beta_1 = 0.57$

| S | r | d | Glass Type | Group |
|---|---|---|---|---|
| 0 | (reticle) | 50.000 | | |
| 1 | −188.0568 | 20.000 | Quartz | G1 |
| 2 | −281.5034 | 0.500 | | |
| 3 | 431.1247 | 21.392 | Quartz | G1 |
| 4 | −288.5924 | 6.668 | | |
| 5 | 236.2574 | 20.000 | Quartz | G1 |
| 6 | 1882.3987 | 36.559 | | |
| 7 | −357.7902 | 20.000 | Quartz | G1 |
| 8 | 167.6051 | 23.376 | | |
| 9 | −175.6436 | 20.000 | $CaF_2$ | G1 |
| 10 | −1470.5670 | 12.623 | | |
| 11 | −186.9077 | 20.000 | Quartz | G1 |
| 12 | −1274.9545 | 23.974 | | |
| 13 | −286.1706 | 20.000 | Quartz | G1 |
| 14 | −211.3700 | 0.500 | | |
| 15 | 701.0264 | 38.078 | Quartz | G1 |
| 16 | −261.5668 | 0.500 | | |

TABLE 1-continued

Exposure wavelength = 193.3 nm ± 5 pm
Quartz (synthetic quartz): refractive index = 1.56033
$CaF_2$ (fluorite): refractive index = 1.50146
Image-side NA = 0.650
Exposure region: a = 25 mm  b = 6 mm
$1/\beta_1 = 0.57$

| S | r | d | Glass Type | Group |
|---|---|---|---|---|
| 17 | −598.9669 | 20.647 | Quartz | G1 |
| 18 | −271.9048 | 5.943 | | |
| 19 | −230.3536 | 20.000 | Quartz | G1 |
| 20 | −404.2724 | 0.500 | | |
| 21 | −893.4980 | 20.000 | Quartz | G1 |
| 22 | −524.1623 | 100.000 | | |
| 23 | ∞ | −220.000 | Plane Mirror | M |
| 24 | ∞ | −115.000 | Quartz | |
| 25 | ∞ | 115.000 | Quartz | BS (reflective) |
| 26 | ∞ | 42.590 | | |
| 27 | −205.0171 | 20.000 | Quartz | G2 |
| 28 | −362.2973 | 0.500 | | |
| 29 | −584.5154 | −0.500 | Concave Mirror | G2 |
| 30 | −362.2973 | −20.000 | Quartz | G2 |
| 31 | −205.0171 | −42.590 | | |
| 32 | ∞ | −115.000 | Quartz | |
| 33 | ∞ | −115.000 | Quartz | BS (transmissive) |
| 34 | ∞ | −10.000 | | |
| 35 | (aperture stop) | −5.000 | | |
| 36 | −214.1175 | −45.000 | Quartz | G3 |
| 37 | −1561.0010 | −14.542 | | |
| 38 | 707.0832 | −35.000 | Quartz | G3 |
| 39 | −243.0109 | −7.154 | | |
| 40 | −344.7902 | −35.000 | $CaF_2$ | G3 |
| 41 | 472.9348 | −0.500 | | |
| 42 | −246.5665 | −35.000 | $CaF_2$ | G3 |
| 43 | 16237.2470 | −21.872 | | |
| 44 | −115.5125 | −29.384 | $CaF_2$ | G3 |
| 45 | −1618.6280 | −5.704 | | |
| 46 | 703.4519 | −20.000 | Quartz | G3 |
| 47 | −672.9060 | −0.500 | | |
| 48 | −368.2245 | −40.350 | Quartz | G3 |
| 49 | 1073.8114 | −0.500 | | |
| 50 | −572.4918 | −20.000 | Quartz | G3 |
| 51 | −3000.0000 | −17.000 | | |
| 52 | (wafer) | | | |

TABLE 2

Exposure wavelength = 193.3 nm ± 5 pm
Quartz (synthetic quartz): refractive index = 1.56033
$CaF_2$ (fluorite): refractive index = 1.50146
Image-side NA = 0.60
Exposure region: a = 25 mm  b = 6 mm
$1/\beta_1 = 0.51$

| S | r | d | Glass Type | Group |
|---|---|---|---|---|
| 0 | (reticle) | 50.000 | | |
| 1 | −179.5776 | 20.000 | Quartz | G1 |
| 2 | −282.5988 | 0.500 | | |
| 3 | 454.1650 | 22.901 | Quartz | G1 |
| 4 | −252.3208 | 5.836 | | |
| 5 | 233.6302 | 20.000 | Quartz | G1 |
| 6 | 1110.1931 | 33.789 | | |
| 7 | −303.6817 | 20.000 | Quartz | G1 |
| 8 | 181.8725 | 19.204 | | |
| 9 | −270.4288 | 20.000 | $CaF_2$ | G1 |
| 10 | 21100.7147 | 17.698 | | |
| 11 | −148.2217 | 20.000 | Quartz | G1 |
| 12 | −849.3763 | 24.229 | | |
| 13 | −286.5078 | 20.000 | Quartz | G1 |
| 14 | −206.8107 | 0.500 | | |
| 15 | 772.3575 | 36.184 | Quartz | G1 |
| 16 | −275.2952 | 0.500 | | |

TABLE 2-continued

Exposure wavelength = 193.3 nm ± 5 pm
Quartz (synthetic quartz): refractive index = 1.56033
$CaF_2$ (fluorite): refractive index = 1.50146
Image-side NA = 0.60
Exposure region: a = 25 mm  b = 6 mm
$1/\beta_1 = 0.51$

| S | r | d | Glass Type | Group |
|---|---|---|---|---|
| 17 | −588.4319 | 20.000 | Quartz | G1 |
| 18 | −280.6383 | 5.486 | | |
| 19 | −240.2882 | 20.000 | Quartz | G1 |
| 20 | −450.1379 | 0.500 | | |
| 21 | −6350.6655 | 20.000 | Quartz | G1 |
| 22 | −631.0481 | 100.000 | | |
| 23 | ∞ | −270.000 | Plane Mirror | M |
| 24 | ∞ | −110.000 | Quartz | |
| 25 | ∞ | 110.000 | Quartz | BS (reflective) |
| 26 | ∞ | 37.334 | | |
| 27 | −202.0637 | 20.000 | Quartz | G2 |
| 28 | −353.9158 | 0.500 | | |
| 29 | −571.0735 | −0.500 | Concave Mirror | G2 |
| 30 | −353.9158 | −20.000 | Quartz | G2 |
| 31 | −202.0637 | −37.334 | | |
| 32 | ∞ | −110.000 | Quartz | |
| 33 | ∞ | −110.000 | Quartz | BS (transmissive) |
| 34 | ∞ | −10.000 | | |
| 35 | (aperture stop) | −5.000 | | |
| 36 | −192.8373 | −31.424 | Quartz | G3 |
| 37 | −665.8447 | −12.739 | | |
| 38 | 1564.0875 | −35.000 | Quartz | G3 |
| 39 | −250.0795 | −19.121 | | |
| 40 | −407.4761 | −35.000 | $CaF_2$ | G3 |
| 41 | 617.7314 | −0.500 | | |
| 42 | −231.8625 | −35.000 | $CaF_2$ | G3 |
| 43 | 13701.5774 | −5.993 | | |
| 44 | −127.4513 | −26.172 | $CaF_2$ | G3 |
| 45 | −2284.2542 | −5.838 | | |
| 46 | 571.7610 | −23.983 | Quartz | G3 |
| 47 | −342.8918 | −0.500 | | |
| 48 | −213.0073 | −45.000 | Quartz | G3 |
| 49 | 1139.9867 | −3.123 | | |
| 50 | −429.2310 | −20.000 | Quartz | G3 |
| 51 | −3000.0000 | −17.000 | | |
| 52 | (wafer) | | | |

As can be seen from the aberration plots in FIGS. 2a–c and 4a–c, Working Examples 1 and 2 have excellent imaging performance.

While the present invention has been described in connection with preferred embodiments and Working Examples, it will be understood that it is not so limited. On the contrary, it is intended to cover all alternatives, modifications and equivalents as may be included within the spirit and scope of the invention as defined in the appended claims.

What is claimed is:

1. A catadioptric projection lens having an object plane and an image plane, the lens comprising in order from the object plane to the image plane:

a.) a first lens group having one or more refractive lens elements and disposed along a first optical axis;

b.) a first mirror which creates a second optical axis that is not parallel to said first optical axis;

c.) a beam splitter, disposed along said second optical axis, which creates a third optical axis that is parallel to said first optical axis;

d.) a second lens group having one or more refractive lens elements and a concave mirror, said second lens group disposed along said third optical axis adjacent said beam splitter and opposite the image plane;

e.) a third lens group having one or more refractive lens elements and disposed along said third optical axis immediately adjacent the image plane; and f.) wherein all refractive lens elements in the catadioptric projection lens have optical axes that extend in parallel.

2. A catadioptric projection lens according to claim 1, wherein said first mirror is planar.

3. A catadioptric projection lens according to claim 1, wherein said beam splitter is one chosen from the group of beam splitters consisting of: plate-type, prism-type, polarizing plate-type and polarizing prism-type.

4. A catadioptric projection lens according to claim 1, wherein said first lens group has a magnification $\beta_1$, and which satisfies the condition $$-1<1/\beta_1<1.$$

5. A catadioptric projection lens according to claim 1, further including an aperture stop disposed between said third lens group and said beam splitter.

6. A catadioptric projection lens according to claim 1, wherein said refractive lens elements are made of material selected from the group of materials consisting of: quartz and calcium fluoride.

7. A catadioptric projection lens according to claim 1, wherein said beam splitter is a polarizing beam splitter, and further including a ¼ wave plate between said beam splitter and said concave mirror.

8. A catadioptric projection lens according to claim 1, having optimum aberration correction at a center wavelength of 193 nm and a bandwidth of ±5 pm about said center wavelength.

9. A projection optical system comprising:
   a) the projection lens of claim 1 disposed such that said first and third axes are parallel to the direction of gravity;
   b) a reticle holder capable of holding a reticle at or near the object plane;
   c) a source of illumination disposed adjacent said reticle holder and opposite said projection lens; and
   d) a workpiece holder disposed adjacent said projection lens on the image-plane side, said workpiece holder capable of holding a workpiece at or near the image plane of said projection lens.

10. A catadioptric reduction projection optical system comprising:
   a.) a plurality of refractive lens elements, each having an optical axis;
   b.) a plane mirror;
   c.) a beam splitter;
   d.) at least one concave mirror;
   e.) wherein optical axes of all the refractive lens elements in the catadioptric projection optical system are mutually parallel;
   f.) reduction imaging is performed from a first surface to a second surface by the catadioptric reduction projection optical system; and
   g.) the first surface and the second surface are parallel to each other.

11. A catadioptric projection optical system according to claim 10, wherein said at least one concave mirror has an optical axis, further wherein said plurality of optical lenses and said at least one concave mirror are positioned so that said optical axes of said plurality of lenses and said optical axis of said at least one concave mirror are all parallel to the direction of the force of gravity.

12. A catadioptric projection optical system according to claim 10, wherein all optical elements included in the catadioptric projection optical system are positioned between a first plane that includes said first surface and a second plane that includes said second surface.

13. A catadioptric projection optical system according to claim 11, wherein all optical elements included in the catadioptric projection optical system are positioned between a first plane that includes said first surface and a second plane that includes said second surface.

14. A catadioptric projection optical system according to claim 9, including in the order that rays pass from said first surface:
   a) a first optical system;
   b) said plane mirror;
   c) said beam splitter, wherein said beamsplitter has a reflection optical path and a transmission optical path;
   d) a second optical system arranged in said reflection optical path;
   e) a third optical system arranged in an optical path on a side of said beam splitter opposite said second optical system; and
   f) wherein said second optical system includes said at least one concave mirror.

15. A catadioptric projection optical system according to claim 14, further including a pair of right triangular prisms having an adhesion surface, wherein said beam splitter is formed on said adhesion surface.

16. A catadioptric projection optical system according to claim 15, wherein said first optical system has a positive refracting power, and said first optical system has an image formation magnification $\beta_1$ satisfying the condition:

$$-1.0<1/\beta_1<1.0.$$

17. A catadioptric projection optical system according to claim 14, further including a variable aperture stop positioned either (a) between said beam splitter and said third optical system or (b) inside said third optical system, further wherein said variable aperture stop is telecentric to said second surface.

18. A catadioptric projection optical system according to claim 14, wherein said beam splitter is a polarizing beam splitter and the catadioptric projection optical system has a ¼ wavelength plate between said polarizing beam splitter and said concave mirror.

19. A catadioptric projection optical system according to claim 11, including in the order that rays pass from said first surface:
   a) a first optical system;
   b) said plane mirror;
   c) said beam splitter, wherein said beamsplitter has a reflection optical path and a transmission optical path;
   d) a second optical system arranged in said reflection optical path;
   e) a third optical system arranged in an optical path on a side of said beam splitter opposite said second optical system; and
   f) wherein said second optical system includes said at least one concave mirror.

20. A catadioptric projection optical system according to claim 19, further including a pair of right triangular prisms having an adhesion surface, wherein said beam splitter is formed on said adhesion surface.

21. A catadioptric projection optical system according to claim 20, wherein said first optical system has a positive refracting power, and said first optical system has an image formation magnification $\beta_1$ satisfying the condition:

$$-1.0<1/\beta_1<1.0.$$

22. A catadioptric projection optical system according to claim 19, further including a variable aperture stop positioned either (a) between said beam splitter and said third optical system or (b) inside said third optical system, further wherein said variable aperture stop is telecentric to said second surface.

23. A catadioptric projection optical system according to claim 19, wherein said beam splitter is a polarizing beam splitter and the catadioptric projection optical system has a ¼ wavelength plate between said polarizing beam splitter and said concave mirror.

24. A catadioptric projection optical system according to claim 12, including in the order that rays pass from said first surface:

a) a first optical system;

b) said plane mirror;

c) said beam splitter, wherein said beamsplitter has a reflection optical path and a transmission optical path;

d) a second optical system arranged in said reflection optical path;

e) a third optical system arranged in an optical path on a side of said beam splitter opposite said second optical system; and f) wherein said second optical system includes said at least one concave mirror.

25. A catadioptric projection optical system according to claim 24, further including a pair of right triangular prisms having an adhesion surface, wherein said beam splitter is formed on said adhesion surface.

26. A catadioptric projection optical system according to claim 25, wherein said first optical system has a positive refracting power, and said first optical system has an image formation magnification $\beta_1$ satisfying the condition:

$$-1.0<1/\beta_1<1.0.$$

27. A catadioptric projection optical system according to claim 24, further including a variable aperture stop positioned either (a) between said beam splitter and said third optical system or (b) inside said third optical system, further wherein said variable aperture stop is telecentric to said second surface.

28. A catadioptric projection optical system according to claim 24, wherein said beam splitter is a polarizing beam splitter and the catadioptric projection optical system has a ¼ wavelength plate between said polarizing beam splitter and said concave mirror.

29. A catadioptric projection optical system according to claim 10, wherein the beam splitter selectively transmits and reflects light.

30. A catadioptric projection optical system according to claim 10, wherein when imaging is performed from the first surface to the second surface, an image from the first surface passes through substantially all of the refractive lens elements a single time.

* * * * *